United States Patent [19]
Koker

[11] Patent Number: 5,132,931
[45] Date of Patent: Jul. 21, 1992

[54] SENSE ENABLE TIMING CIRCUIT FOR A RANDOM ACCESS MEMORY

[75] Inventor: Gregory T. Koker, Stoughton, Mass.

[73] Assignee: Analog Devices, Inc., Norwood, Mass.

[21] Appl. No.: 574,201

[22] Filed: Aug. 28, 1990

[51] Int. Cl.$^5$ .............................................. G11C 7/00
[52] U.S. Cl. .................................... 365/210; 365/233; 365/203
[58] Field of Search ............... 365/210, 200, 233, 149, 365/203

[56] References Cited

U.S. PATENT DOCUMENTS 4,339,766  7/1982  Rao ................................. 365/149 X

FOREIGN PATENT DOCUMENTS 2600808  12/1987  France .

Primary Examiner—Joseph A. Popek
Attorney, Agent, or Firm—Wolf, Greenfield & Sacks

[57] ABSTRACT

A sense enable timing circuit for addressing data locations in a static random access memory (RAM) array provides a plurality of memory cells formed into a dummy row and a dummy column that is connected to a memory cell at a far end opposite an X-decoder input of said dummy row. The dummy row and column are constructed in conjunction on the same semiconductor chip with a RAM array comprising a plurality of memory cells formed into rows and columns. The dummy column connects to a dummy word line of the dummy row and includes dummy bit lines. Each of the dummy word and bit lines are separate from the word lines and bit lines of the array. The dummy word line is addressed at a time synchronized with the addressing of the array word lines. The occurrence of a predetermined voltage change on at least one of the dummy bit lines, carrying a signal of at least one memory cell of the dummy column, is determined in response to the addressing of the dummy word line. In response to this determination, the sensing of array bit line signal is enabled. The signal carried by the dummy bit line may be generated by a plurality of adjacent memory cells.

31 Claims, 8 Drawing Sheets

SENSE ENABLE TIMING CIRCUIT FOR A RANDOM ACCESS MEMORY

FIELD OF THE INVENTION

This invention relates to a sense enable timing circuit for static random access memory (RAM) and, more particularly, to a circuit that increases the speed and reduces the power consumption of static RAM accessing.

BACKGROUND OF THE INVENTION

When constructing static random access memories (RAMs), it is desirable to increase the speed at which memory locations are accessed and their data read, while reducing total power consumption of the memory array and accessing circuitry. To accomplish both goals, the data stored at a particular memory location should be sensed as quickly as possible after that location is initially addressed. This is usually accomplished by sensing a voltage drop on one of the complementary high/low outputs of the data output lines of a memory array column.

Operating speed is increased and power consumption is reduced specifically by sensing the voltage drop at the data output lines well in advance of their complete voltage drop. The voltage drops relatively slowly in a large array owing to the inherent capacitance of the memory cells, which presents significant impedance on row word lines and column bit lines. Thus the sensing may occur when only a few hundred millivolts of voltage drop have actually occurred. This small drop is subsequently amplified to a full logic state voltage (e.g., 0 or 5 volts) by an in line sense amplifier.

A significant problem with such a voltage drop sensing system is that timing of the sense amplification operation must be very accurately controlled. If the sensing occurs too soon, the voltage drop may not be sufficient, or stable enough, to guarantee a reliable reading of the prevailing logic state in the presence of the inherent electrical noise. Similarly, if the voltage drop sensing function occurs too late, a significant amount of extra power and time may be wasted in acquiring the data signal. As microcircuits become larger and operated at higher clock rates, it becomes even more important to avoid such waste.

In the past, sense enable timing has particularly been accomplished by providing a sense enable signal to a sense amplifier connected to the data output lines. The sense amplifier senses the data output lines only upon receiving the sense enable signal. The timing of this sense enable signal is based upon the delay in the propagation of the row address signal and the additional propagation time of a data value down the column bit lines. In the prior art sense enable signal operating circuit of FIG. 1, the assertion of a sense enable signal SE is delayed by the combined propagation delays of a long series of inverters 15, connected from a RAM precharge or other word line enabling signal (WORD LINE ENABLE) 16. With adjustments for this inherent delay and other particular array characteristics, the delay circuit roughly approximates the time required to attain a stable signal at the input of a sense amplifier.

However, the semiconductors produced by various manufacturers, as well as the batches of a given manufacturer, may be highly variable in their operating characteristics. This is particularly true relative to the speed of operation and curves of voltage output versus time for data output signals. As such, while a delay scheme such as that shown in FIG. 1 may work well for the array of one manufacturer, it may prove wasteful or wholly inoperative when used with another manufacturer's semiconductors owing to their differing operating rates or output voltage versus time curves. It may also be desirable to employ differing transistor technologies such as NMOS or gallium arsenide.

Therefore, in order to use the FIG. 1 scheme while optimizing the timing of the sense enable function, it would be necessary to tailor the delay circuit to each semiconductor manufacturers processing and even to various batches of the same manufacturer. Clearly, given the cost of masking and manufacturing a mass produced semiconductor chip, this is not practical. Thus, as a practical matter, all the circuits must be tailored to the slowest functioning components that are anticipated.

SUMMARY OF THE INVENTION

It is therefore an object of the present invention to provide a sense enable timing circuit that allows accessing of a RAM array at high speed and with a minimum of power consumption.

It is another object of this invention to provide a timing circuit that operates predictably in different RAM types produced by a number of different manufacturers using different transistor technologies.

It is yet another object of this invention to provide a timing circuit that adds no unnecessary delays to the signal response of the RAM array.

According to this invention, a sense enable timing circuit for addressing data locations in a static random access memory (RAM) comprising an array of rows and columns of memory cells provides, as an adjunct to the array itself, a dummy row and a dummy column each having a plurality of memory cells formed on the same semiconductor chip. The memory cells of the dummy row and column are substantially identical to those of the RAM array. The dummy column has memory cells connected from a cell on a far end of the dummy row opposite the row end having the X-decoder input. Although the precharge and power supply circuitry are shared by both the array and dummy row and column, the row has a dummy word line and the column has dummy bit lines separate from the word lines and bit lines of the array. The dummy word line is addressed simultaneously with the addressing of the array word lines. The addressing of the dummy word line, after an interval of time, causes the dummy bit lines to respond by changing their voltage level. A determination circuit connected to the end of the dummy bit lines determines when at least one of the dummy bit lines has undergone a predetermined voltage change. The predetermined change is dependent upon the number of memory cells connected in parallel to the dummy word line along the dummy column (the other dummy cells have word lines deasserted, which in this example implies that they are connected to ground), since the greater the number of cells connected, the greater the voltage change would be for a given interval of time. The output of this determination circuit is used to enable sense amplifiers. Each sense amplifier is enabled by the circuit output at a time when a predetermined voltage change on the dummy bit lines has occurred. Since the dummy bit line signal is synchronized with and proportional to the array bit line signal, the predetermined voltage change on the dummy bit lines is set to occur at a point in time when a corresponding easily amplifiable, but relatively small, voltage change on the array bit lines has occurred. Thus, if the predetermined voltage change in the dummy bit lines is chosen to be a value that insures a corresponding readable signal on the array bit lines, the sense amplifier is always triggered at a time that insures a reliably amplifiable signal.

BRIEF DESCRIPTION OF THE DRAWING

The foregoing objects and advantages of the present invention will be more clearly understood in connection with the accompanying drawings in which.

DETAILED DESCRIPTION

Figure 2:
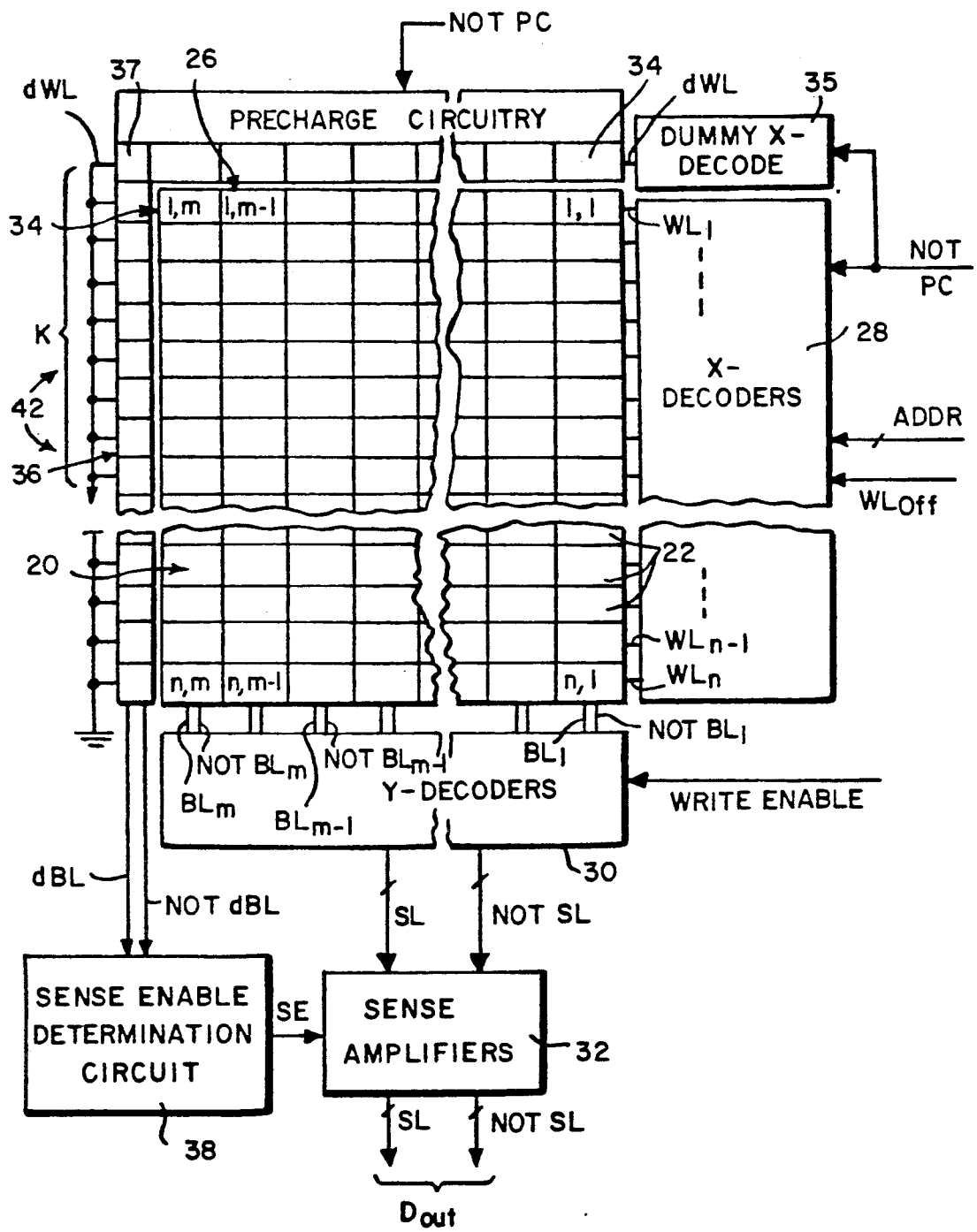
FIG. 2 is a broken block diagram of a RAM memory array including a timing circuit having a dummy row and column according to this invention.

A sense enable timing circuit according to the invention is depicted schematically in FIG. 2. The circuit may, for example, be constructed from MOSFET transistor logic upon a single semiconductor microchip. Of course, other circuiting may be present on the same chip. For example, the circuit may be integrally constructed upon a microprocessor chip to be used in conjunction with the microprocessor; in such a case, the circuit might be used as a program RAM or data RAM.

The circuit consists generally of a RAM array 20 having a group of memory cells shown schematically as boxes 22 in FIG. 2. The RAM is normally in a read mode but may be placed into a write mode by asserting WRITE ENABLE. In the following discussion, it should be assumed that the RAM is in a read mode unless otherwise stated. The cells are formed into groups of horizontal rows 24 and vertical columns 26. Each particular row is accessed, (i.e., made active) by a distinct corresponding word line $WL_i$ designated $WL_1$-$WL_n$. A particular word line "i" is accessed with a parallel bus carrying a multibit signal ADDR to a bank of X-decoders 28. Each decoder translates a group of distinct bits from ADDR in order to ascertain a prevailing word line address signal bit $WL_1$-$WL_n$ (Refer also to FIG. 10 for details of the X decoders).

A standard feature in static RAM designs is a precharge cycle. After a precharge cycle signal NOT PC is deasserted, the X decoder 28 enables the addressed row (being one with a high value for $WL_i$) to activate each cell along it, allowing a data value, high or low, contained in each cell of the addressed row, to begin propagating along the bit lines, from the particular active row cell of each column. At the termination of each column, the bit lines exit into a number of Y-decoders 30 (in this example a bank of CMOS mux circuits) that each assemble a group of individual bits into a parallel bus signal.

The bit line for each column provides a pair of complementary outputs. Note that in the case where complementary outputs are provided, and only one complement in an asserted state may be discussed, it should be clear to those skilled in the art that an unasserted complement is also implied.

Like the bit lines themselves, the Y-decoders 30 each also provide a pair of complementary parallel output signals over complementary sense line output buses designated SL and NOT SL. These sense line output buses, as stated previously, present signals corresponding in voltage characteristics to those on the bit lines and, thus, experience a relatively slow voltage change over time, following the assertion an addressing word line signal. The sense line voltage change must be sensed and amplified as soon as a readable value is ascertained, in order to optimize performance. As such, each pair of sense line outputs is directed to one of a bank of corresponding sense amplifiers 32 that are enabled to function at such time as a discernible data value is present on each of the SL and NOT SL buses. The sense amplifier 32 then outputs a standard logic voltage value (e.g., 0 volts or 5 volts) of data over a corresponding pair of parallel output line $D_{out}$ and NOT $D_{out}$. As used herein, "amplifier" is meant to include circuits performing a non-linear switching function.

As stated previously, since various manufacturers, processes and semiconductor types operate at differing rates and voltage drops, it is necessary to account for and accommodate the characteristics of the particular memory array being used in order to most efficiently time the occurrence of a readable signal at the bit line outputs. As such, an integral dummy row 34 and a dummy column 36 connected from the memory cell at the far end 37 of the dummy row 34 are formed on a semiconductor chip as part of the overall memory array. By "far end" it is meant the memory cell in a location on the row as far as possible from the end having the dummy X decoder 35 input. This dummy row and dummy column have bit lines and word lines that are connected only to each other and are not connected to the array except for power supply $V_{CC}$, around and precharge NOT PC. They, therefore, include a separate dummy word line dWL from a dummy X decoder 35 and dummy bit line complements dBL and NOT dBL.

Since the dummy row 34 and column 36 are constructed in the same way, from the same materials and processes, and are approximately the same size (number of cells per row and column) as the actual memory array 20, they closely match the electrical characteristics of the array in the approximate worst case of a word line signal delay. The dummy row and column represent the worst case, since they are formed with the column connected to the cell at the far end 37 of the row, thus ensuring the largest possible signal path.

Therefore, if dummy word line dWL is activated at the same time as the array word line WL$_i$, the innate impedance of the full length of the dummy row 34 and dummy column 36 causes the propagation of a dummy bit line signal dBL and NOT dBL that has an impedance that closely matches that of a real array bit line impedance.

Figure 10:
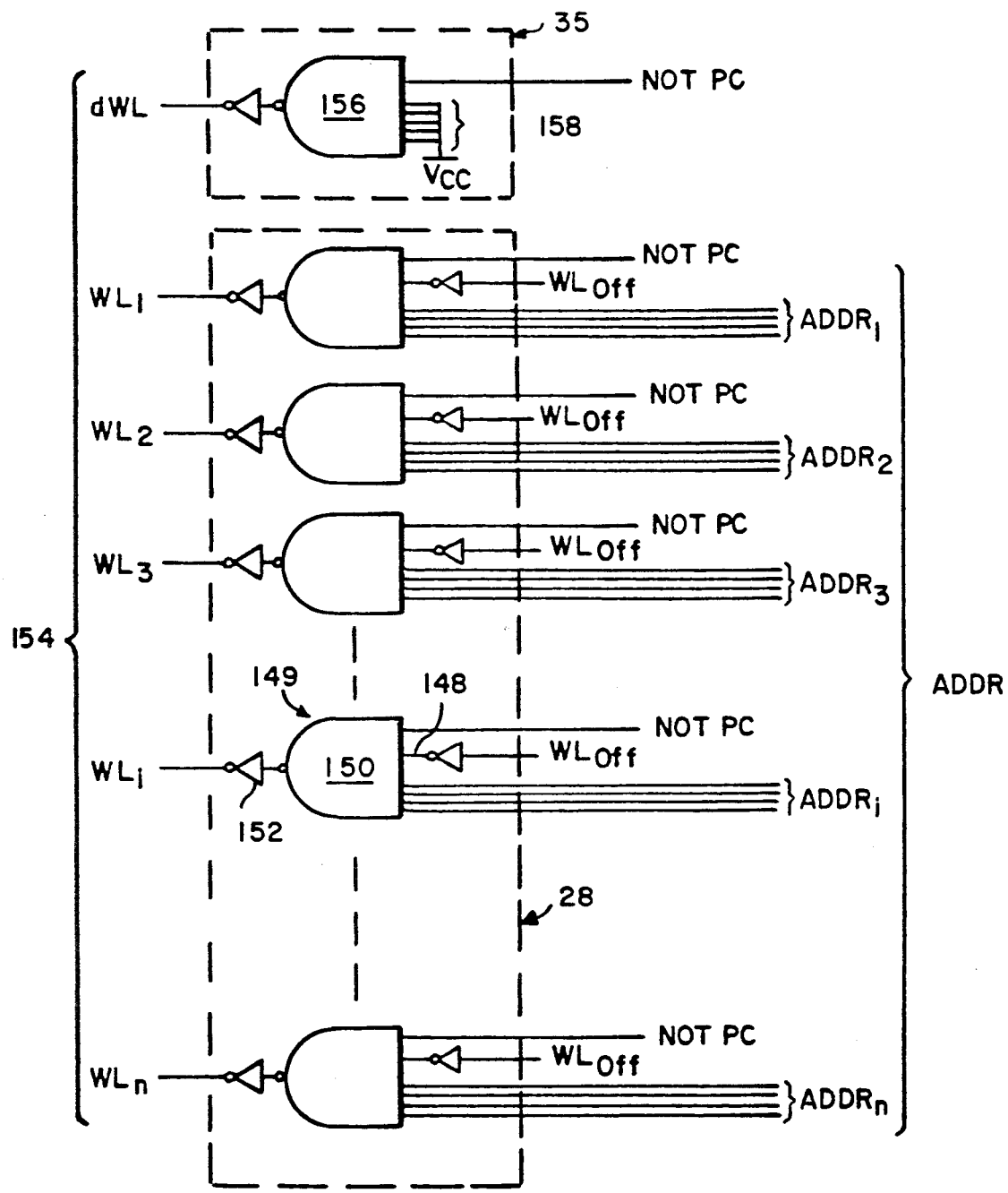
FIG. 10 is a schematic diagram of an X decoder including the implementation of the $WL_{off}$ signal of FIG. 9.

The timing of the dWL and WL$_i$ signals in this example is synchronized since the X-decoders 28 and dummy X-decoder 35 are both clocked simultaneously by NOT PC (see also FIG. 10). This mimicking of the real array characteristics by the dummy row 34 and dummy column 36 always occurs despite the variability of transistor technology and manufacturing techniques employed, since the real and dummy memory cells are essentially identical. Thus, the same impedance matching can be employed in NMOS, GMOS, bipolar and gallium arsenide technologies without altering the circuit design. The dummy bit line signal may, if necessary, be made slightly slower than that of the real array by adding more cells to the dummy row if a greater safety margin is desired. Note that since the dummy bit line signal is sensed independently of the array bit line, it causes no extra time delay or load upon the actual bit line signals.

A sensing operation may, therefore, be directly based upon the dummy bit line voltage curve in order to activate the sense amplifiers 32 at the correct time to optimize performance. This is accomplished by a sense enable determination circuit 38 that receives an input from dBL and outputs an enabling signal SE to the sense amplifiers.

It is important that the dummy bit line signal always have predictable changes in voltage output at each complement dBL and NOT dBL. In this way, the sense enable determination circuit 38 may always be presented with a voltage drop from five volts to zero volts rather than a voltage rise at dBL. The actual ascertainable voltage change from which a stable bit line signal may be reliably amplified is a function of the particular amplifier used, but, for example, may be as small as 500 millivolts, such as the drop 40 shown in FIG. 3. Thus, an emulated drop of 500 millivolts on the dummy bit line could be sufficient to allow triggering of a sense amplifier.

Figure 1:
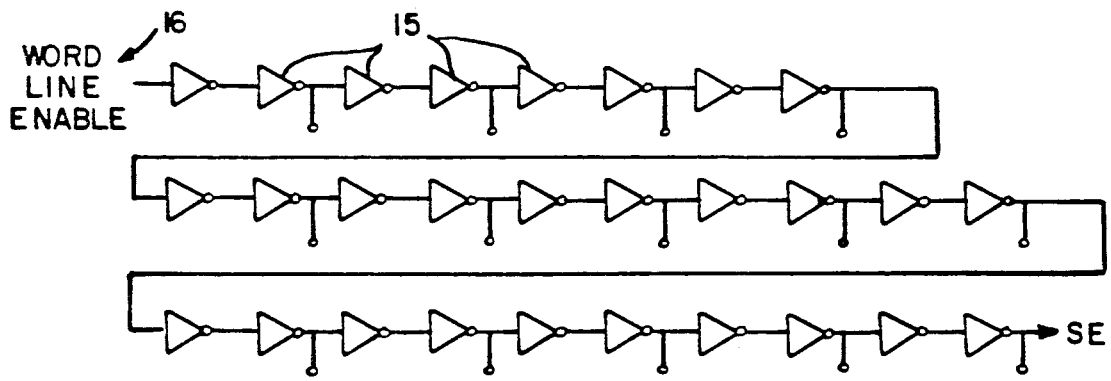
FIG. 1 is a schematic diagram of a conventional timing delay circuit according to the prior art.
Figure 3:
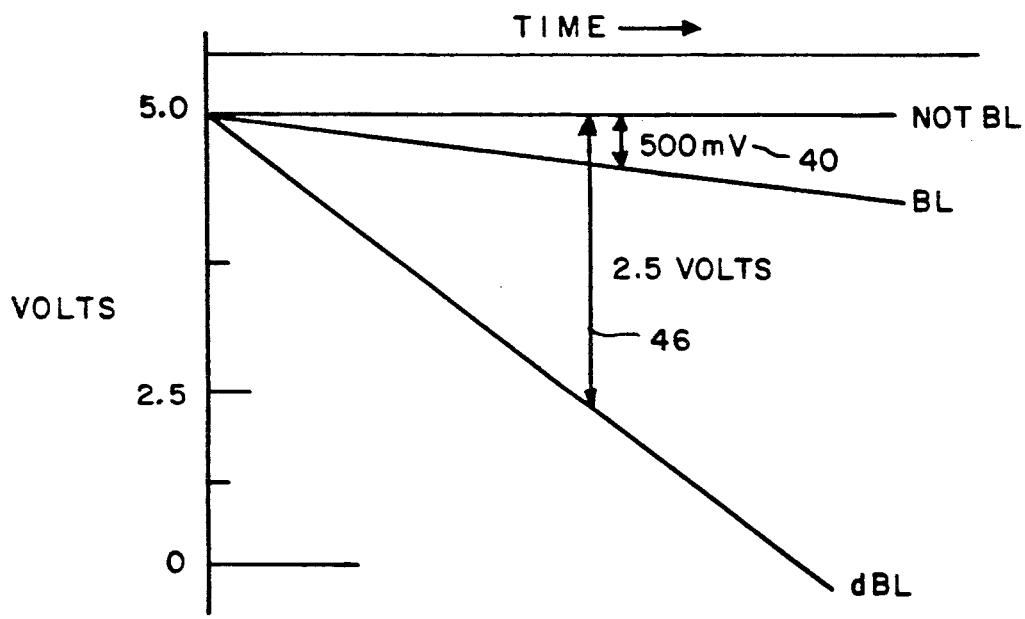
FIG. 3 is a graph showing the voltage drop of a typical bit line signal compared with the dummy bit line signal over time.

However, sensing a 500 millivolt voltage drop may prove somewhat difficult, usually requiring a comparator circuit. Thus, as shown in FIG. 2, the dummy word line dWL from the dummy row 34 connects in parallel to a plurality of at least K adjacent memory cells 42 along the dummy column 36. A plurality of parallel cells may be implemented since they attain a proportional voltage drop relative to a single cell's drop over a given time interval. Furthermore, since dummy and array memory cells are identical, the drop of one relative to the other is always the proportional regardless of the transistor technology employed. Thus, K may be defined as a function of a proportional constant times the change in dummy bit line voltage over the change in array bit line voltage in a given unit of time. K varies largely based upon the particular sense amplifier employed since the amplifier is tailored to a distinct voltage drop. For the particular CMOS example herein, K=12 cells. As depicted in FIG. 3, a roughly 2.5 volt drop may be attained at dummy bit line dBL driven by twelve cells at the same time a corresponding drop of 500 millivolts appears along the array bit line for the transistors of this example.

Figure 4:
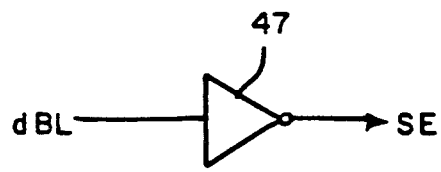
FIG. 4 is a schematic diagram of a sense enable signal generating circuit according to this invention.

Given the sensing of a 2.5 volt drop 46 at the proper enabling time, a standard logic inverter circuit 47 as depicted in FIG. 4 may be utilized to generate the sense enable SE signal since a drop from 5 volts of 2.5 volts or more translates into an inputted zero logic value causing the SE inverted signal to attain a one logic value.

Figure 5:
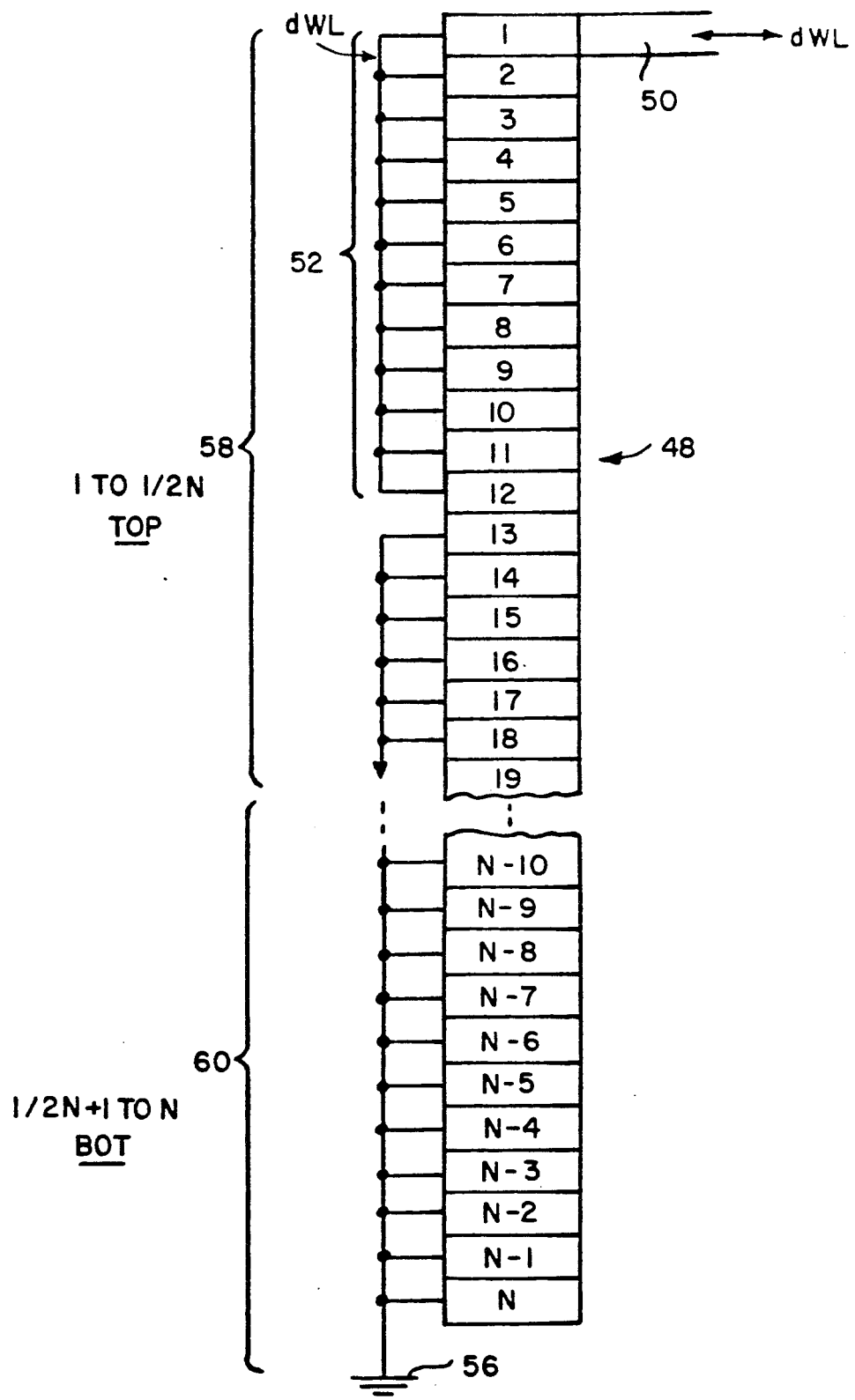
FIG. 5 is a more detailed schematic diagram of the dummy column of FIG. 2, including groups of adjacent cells designated top and bottom.

The particular connection of dummy word line dWL to each of the K active cells is detailed in FIG. 5 which depicts an example of an entire dummy column 48 consisting of N adjacent memory cells. The column connects from the cell on the far end of a dummy row 50 (away from the X decoder input) as also shown in FIG. 2 carrying the dummy word line signal dWL. The K adjacent cells (#'s=1 to 12 in this example) closest to the dummy row row are connected in parallel 52 to dummy word line dWL as detailed. Remaining inactive cells (#'s=13 to N in this example), conversely, have word line inputs that are held deasserted, which in this example (using CMOS transistors) are connected in parallel to ground 56. The remaining cells, therefore, emulate the state of a typical cell in an unaddressed row of the memory array.

The cells in the column 48 of FIG. 5 are divided into two groups, the TOP group 58 of cells which are closer along the bit line to the dummy row 50, and the bottom or BOT group 60 of cells that are further along the dummy column 48 from the dummy row 50. As previously stated, all cells in TOP or BOT except the active cells have word line inputs deasserted, i.e. connected to ground 56.

Figure 6:
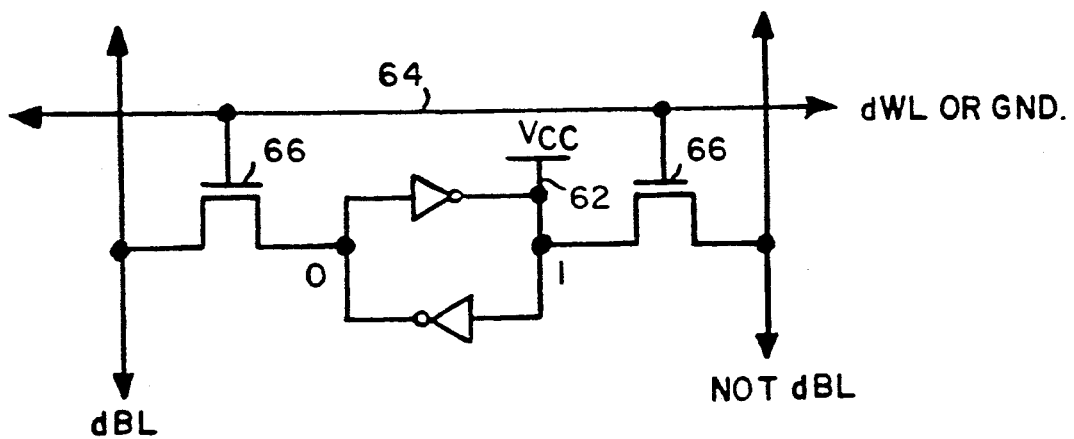
FIG. 6 is a schematic diagram of a top memory cell of the dummy column of FIG. 5.

To further simulate the electrical characteristics of the real array columns, all TOP cells, including the active cells (#'s=1-12 in this example) are additionally configured so that, when addressed, dBL carries a zero logic value and NOT dBL carries a one logic value (FIG. 6 details a typical memory cell). In this example, this occurs because V$_{CC}$, the power supply value 62, is tied permanently to the NOT dBL side of the cell.

Figure 7:
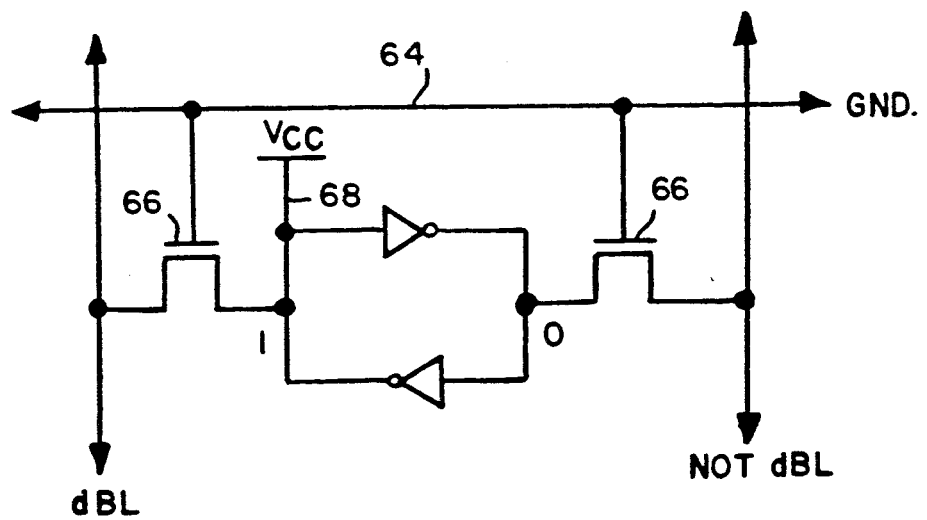
FIG. 7 is a schematic diagram of a bottom memory cell of the dummy column of FIG. 5.

Similarly, all of the bottom cells (BOT) 60 are tied with V$_{CC}$ on the dBL side 68, as shown in FIG. 7 so that dBL always carries a one logic value and NOT dBL always carries a zero logic value. This is the reverse of the TOP data storage arrangement. Since, like the TOP cells in FIG. 6, all BOT cells are deasserted, having word lines 64 connected to ground, the respective pass transistors 66 do not allow these cell's currents to connect with the respective complements of dBL. However, it is still important that these values be present on the various top and bottom cells since they represent the typical data storage situation for a typical array column. This distribution of data storage guarantees a predetermined capacitance matching and consistent data value storage every time the power is turned on. Note that the overall arrangement of TOP and BOT data storage in the dummy column may be reversed while obtaining relatively similar capacitance characteristics.

The division of TOP versus BOT cells is usually one half of the total dummy column number in each group (TOP: #'s=1 to ½N; BOT: #'s=½N+1 to N). As such, the dummy column further matches the capacitance characteristics of the array columns.

Figure 8:
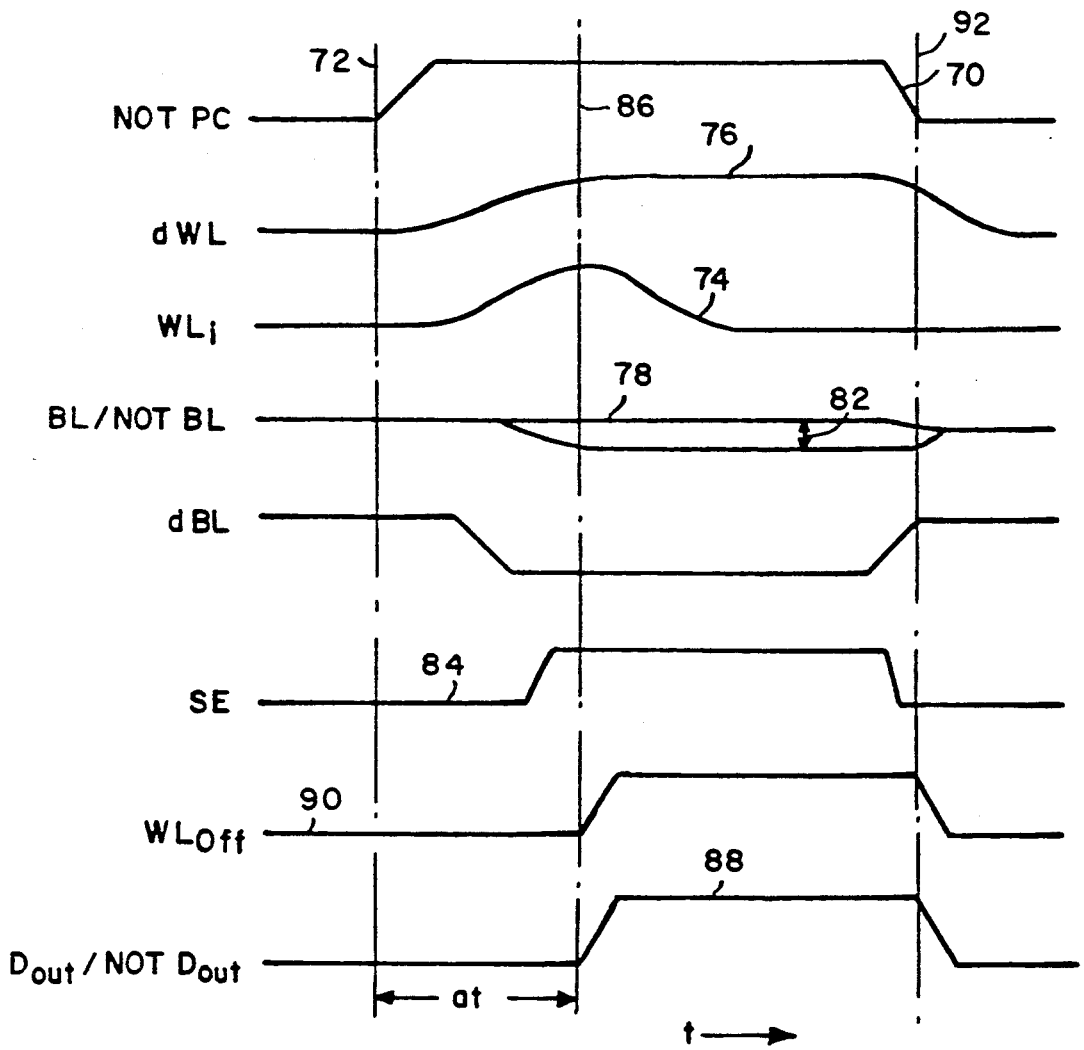
FIG. 8 is a timing diagram of various signals according to this invention.

The signal timing of the sense enable circuit is more particularly depicted in FIG. 8 which shows dependency of the circuit upon the precharqe signal NOT PC. Static RAM requires a precharge signal 70 NOT PC to be asserted with each read or write cycle. This precharge signal, when deasserted, as shown at the first time location 72, allows the typical decoded word line bit signal WL$_i$ 74 and dummy word line dWL 76 signals to activate the cells in a given row. Each of these signals rise relatively slowly to their full values due to the inherent line impedance present in the long rows. However, after WL$_i$ and dWL have attained a particular value, the voltage is sufficient to allow signals of a typical bit line pair BL/NOT BL 78 and the dummy bit line dBL 80 to begin changing potential. Note that the dummy bit line signal 80 is larger than the bit line signal 78 due to the parallel driving by dWL of a multiplicity of K cells, as noted previously.

When dummy bit line dBL has attained a particular value, sense enable SE 84 becomes asserted fairly quickly relative to the other signals. When SE is asserted, amplification occurs and outputted data D$_{out}$/NOT D$_{out}$ 88 becomes available from the corresponding sense amplifier. The D$_{out}$/NOT D$_{out}$ output occurs at a second time 86. The difference between the first and second time 72 and 86, respectively, is the total access time (at), which is nearly optimized by the system.

The signal of the array bit line BL/NOT BL 78 can be limited to a small predetermined voltage drop (for example 500 millivolts) as shown in FIG. 8. This is accomplished by means of a word line deactivating signal WL$_{off}$ 90 that becomes asserted following the sense enable signal SE 84. WL$_{off}$, by deactivating the word line following effective reading of the data by the sense amplifier, prevents each energized cell from further driving their respective bit line voltage potential downward by depowering their word line. As such, access time is not only optimized but power consumed following the access is minimized.

A decoder circuit 149 such as that shown in FIG 10 is used to deactivate each addressed array word line in response to WL$_{off}$. The inverted complement 148 of WL$_{off}$ is input along with NOT PC and a number of address bits ADDR$_i$ (in this example four) of ADDR to a multiple input NAND gate 150 that generates, through an inverter 152, an address signal WL$_i$ when all inputs are asserted. Each row address WL$_i$ is generated by an independent decoder circuit identical to circuit 149. The decoder circuits for each word line address are arranged in parallel into a set 154. This set of circuits 154 comprises the block of X-decoders 28 of FIG. 2. Note that the dummy X-decoder 35 is constructed similarly to each of the X-decoders of the array set 154 to match the appropriate time delays. In this case, however, the NAND gate 156 has inputs 158 other than NOT PC tied permanently to an asserted state V$_{CC}$. Thus, dWL is asserted solely in response to the assertion of NOT PC.

Referring again to the timing diagram of FIG. 8, the bit line signal 78, following assertion of WL$_{off}$, remains flat and subsequently begins returning to a normal high state from its minimal voltage drop at a third time 92, following the assertion of NOT PC. The precharge signal NOT PC should be deasserted long enough to receive a readable and amplifiable signal at D$_{out}$ and should be asserted only long enough to perform a precharge function. Thus, cycle time is minimized.

Figure 9:
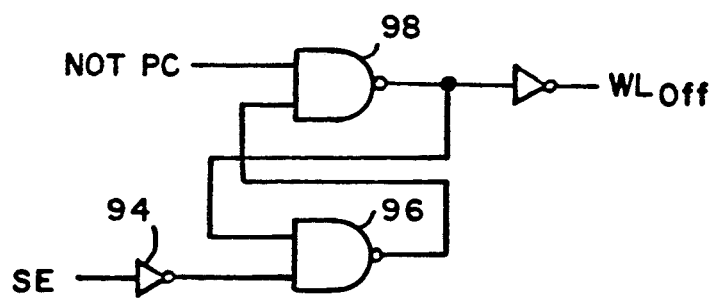
FIG. 9 is a schematic diagram of a word line deactivating signal $WL_{off}$ generating circuit according to this invention.

WL$_{off}$ itself can be generated as shown, for example, in FIG. 9 using the precharqe NOT PC signal and the sense enable SE signal. The generation of WL$_{off}$ is accomplished by means of a NOT R NOT S flip-flop, constructed in this example by generating a complement of the sense enable signal SE with an inverter 94 and inputting it to a two-input NAND gate 96 having an output connected to a second two-input NAND gate 98 also having an input connected to NOT PC. The output of the second NAND gate 98 is also connected to the other input of the NAND gate 96. The output of NAND gate 98 is further connected to an inverter to obtain WL$_{off}$.

Figure 11:
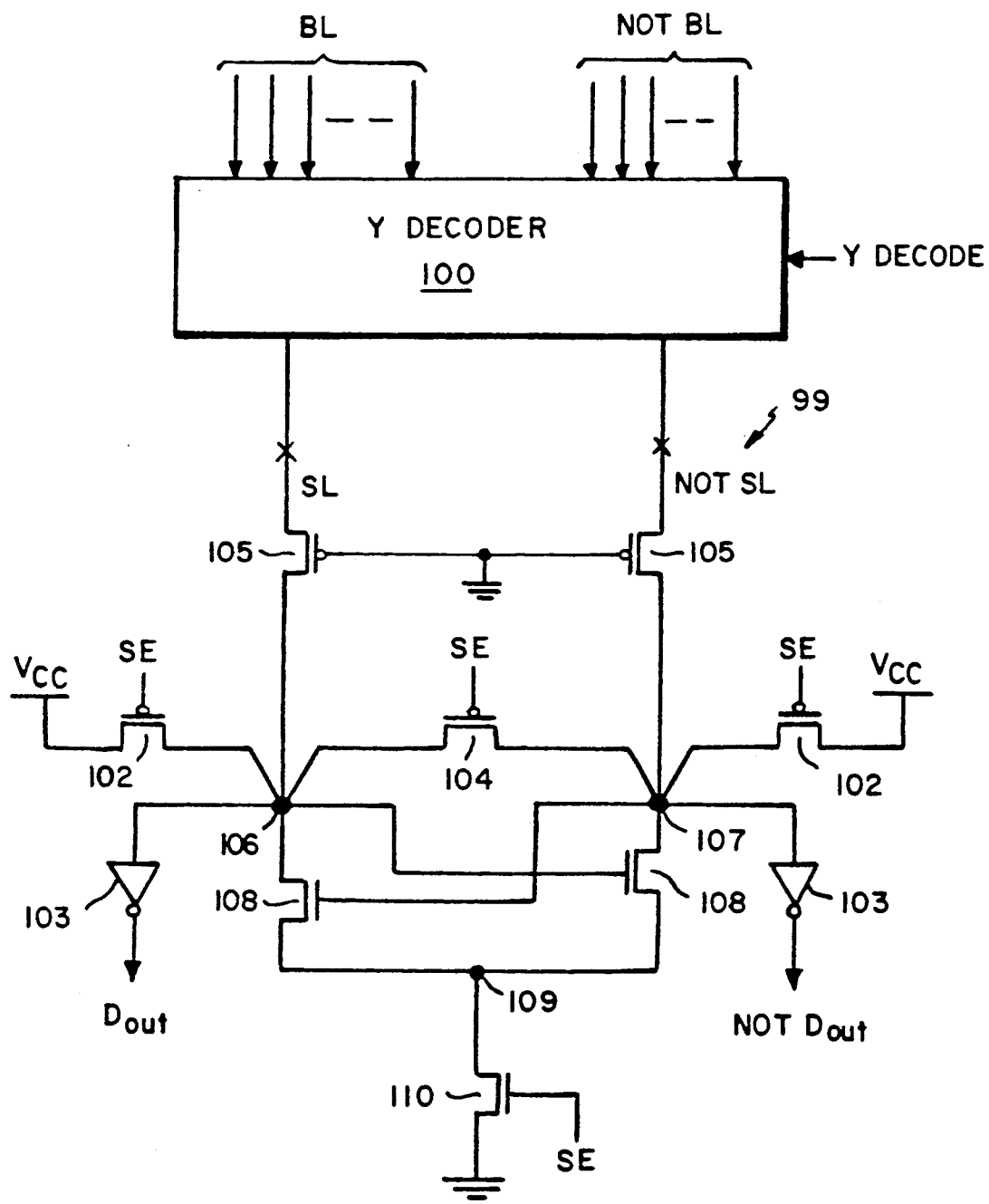
FIG. 11 is a schematic diagram of a sense amplification circuit according to this invention.

The sense amplifier circuit 99 according to this invention is particularly disclosed in FIG. 11. Note that transistors drawn with bubbles at the gates such as 105 are taken as p channel transistors and those without, such as 110, are n channel transistors.

Each multi bit group of complementary bit line outputs BL/NOT BL of the array (groups of 4 or 8 bits, for example) are connected through a corresponding Y decoder 100 that is enabled by a Y DECODE signal. The group of bit line signals exit the decoder as a single complementary pair of sense line signals, SL and NOT SL. Each pair of sense line complements is connected to a corresponding sense amplifier circuit 99. A pair of weak pass transistors 105 (the physical width versus length of the transistors in microns is 3/5), each having gates enabled, i.e. tied to ground, resistively couple the sense line signals to the output nodes 106 and 107. Inverters 103 connected to each of output nodes 106 and 107 generate D$_{out}$ and NOT D$_{out}$ respectively.

At the output nodes 106 and 107 are connected three stronger series transistors. Two of the series transistors 102 each have one lead connected to each of the output nodes 106 and 107 and have their other lead connected to the power supply V$_{CC}$. A third series transistor 104 is connected between the output nodes 106 and 107. Each series transistor 102 and 104 has its gate connected to the sense enable signal SE such that they are decoupled when SE goes high. Two additional transistors 108 are each connected to one of the output nodes 106 and 107 and are also connected to each other at another bottom node 109. These additional transistors 108 have gates cross coupled to the output, node 106 or 107 opposite the output node, 107 or 106 respectively, that they are directly connected to. The bottom node 109 is also connected to an enablinq transistor 110 that has another lead connected to a power supply return (in this case ground) and has a gate enabled by SE.

The circuit precharges the output nodes 106 and 107 when sense enable is deasserted. When SE is then asserted, the differential voltage on SL and NOT SL is amplified by cross coupled transistors 108. The output nodes 106 and 107 are allowed to move rapidly due to the resistive decoupling of weak pass transistors 105.

Figure 12:
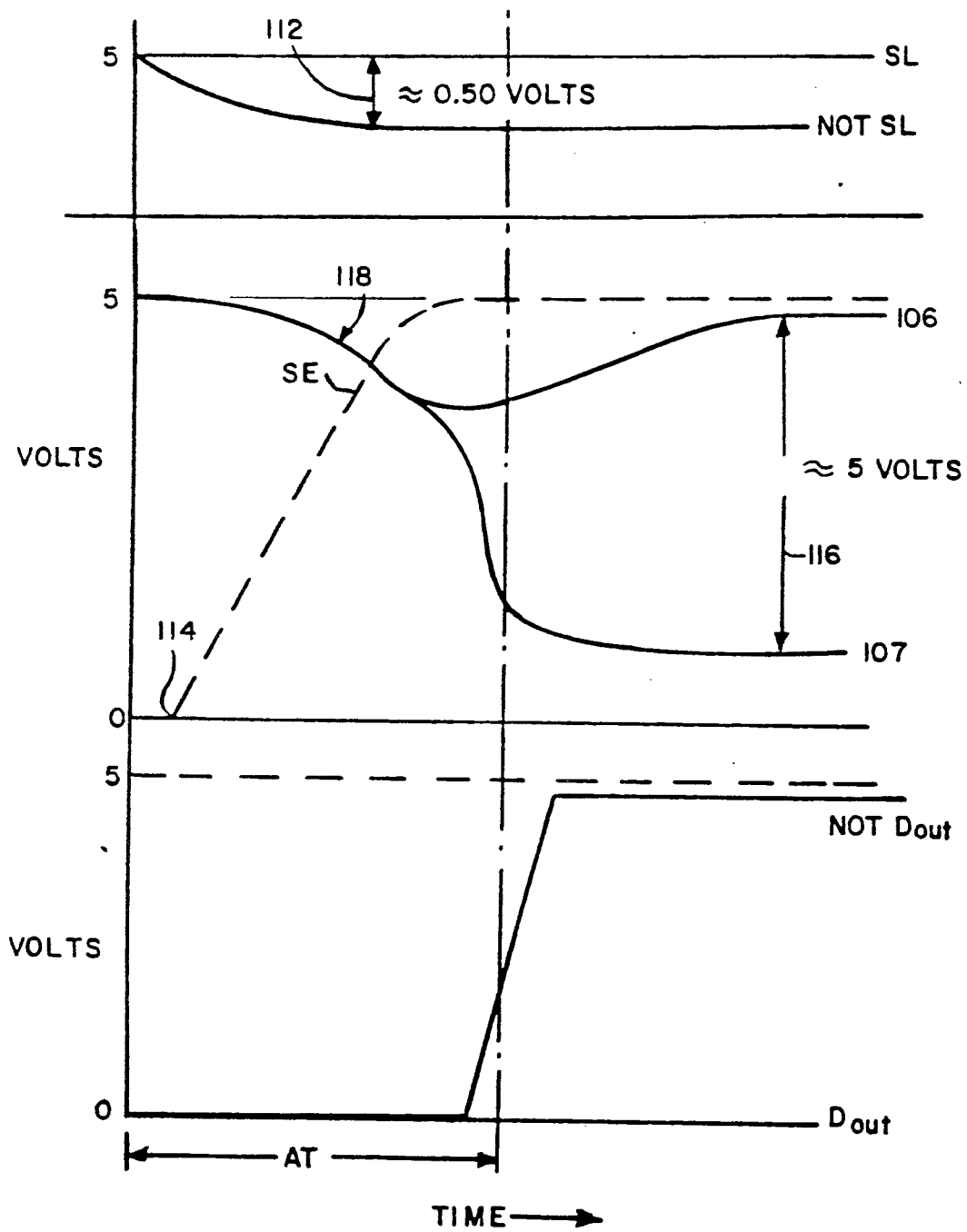
FIG. 12 is a graph showing the response of outputs versus sense line inputs of the sense amplification circuit of FIG. 11.

The performance of the circuit is detailed in FIG. 12. The voltage difference 112 between SL and NOT SL, the sense line voltages, is shown in the upper part of the figure. These voltages diverge at a time 114 after the deassertion of NOT PC. The timing circuit operates over an access time AT in which the signals corresponding to output nodes 106 and 107 begin to drop in voltage as shown by the initial curve 118. Sometime after the assertion of SE, the sense amplifier of FIG. 11 quickly separates and drives, in this example, the node 106 signal back up to a high logic value while driving the node 107 signal downward a difference (116) of 5 volts to a low logic value. D$_{out}$ and NOT D$_{out}$ are, respectively, the inverted values of output node signals 106 and 107 and are depicted at the bottom portion of FIG. 12. As the signal of node 107 falls below the threshold of its inverter, NOT D$_{out}$ rapidly rises. Similarly, as the signal of node 106 never falls below the threshold of its inverter, D$_{out}$ remains low at all times.

Note how this contrasts with the behavior of the node 106 and 107 signals. After an initial fall in voltage, node 106 rises slowly due to the size of the resistive pass transistor 105 while node 107 falls quickly and remains low due to the relative strength of cross coupled and enabling transistors 108 and 110 respectively.

Having described this invention in detail, those skilled in the art will appreciate that numerous modifications may be made without departing from its spirit or scope. Therefore, the specification is meant to be taken by way of example only and is not intended that the scope of the invention be limited to the specific embodiments illustrated and described. Rather, its scope is to be determined by the appended claims and their equivalents.

What is claimed is:

1. A sense enable timing circuit for addressing data locations in a static Random Access Memory (RAM) array having a plurality of memory cells arranged into rows and columns comprising:
    a plurality of additional memory cells arranged in a dummy row and dummy column formed in conjunction with a RAM array of rows and columns, each memory cell of said dummy column connected from a corresponding cell at the far end of said dummy row opposite an X decoder input end and said dummy row having a dummy word line separate from word lines of said array and said dummy column having bit lines separate from bit lines of said array;
    means for addressing said dummy word line at a time synchronized with an addressing of said array word lines;
    means, responsive to said means for addressing, for determining the occurrence of a predetermined voltage change on at least one of said dummy bit lines carrying a signal of at least one memory cell of said dummy column, said memory cell having a word line input connected to said dummy word line; and
    means, responsive to said means for determining, for sensing a signal on said array bit lines.

2. A circuit as set forth in claim 1 wherein said dummy bit line carries a signal generated by a plurality of adjacent memory cells having bit line outputs connected in parallel and word line inputs each connected in parallel to said dummy word line, all other memory cells of said dummy column having word line inputs deasserted.

3. A circuit as set forth in claim 2 wherein said dummy column includes a first group of adjacent memory cells, adjacent said dummy row, each having a first bit line output signal permanently equal to one of a zero and one logic value and having a second bit line output signal permanently equal to the complementary logic value of said first bit line signal.

4. A circuit as set forth in claim 3 wherein said dummy column includes a second group of adjacent memory cells, adjacent said first group of memory cells, each having bit line output signals permanently equal to complementary logic values relative to the bit line output signals of said first group, said second group located further along said column from said dummy row than said first group.

5. A circuit as set forth in claim 4 wherein said second group includes a number of memory cells equal in number to that of said first group.

6. A circuit as set forth in claim 1 wherein said means for determining includes means for comparing said predetermined voltage change to a threshold voltage value.

7. A circuit as set forth in claim 1 wherein said means for sensing includes means for amplifying said predetermined voltage change to equal a standard logic value.

8. A circuit as set forth in claim 7 wherein said means for amplifying includes means, responsive to said means for sensing, for increasing a voltage difference between complementary high and low bit line outputs of said RAM array to equal a standard logic value voltage difference.

9. A circuit as set forth in claim 7 wherein said means for amplifying includes a pair of weak pass transistors each having a first lead connected to each of at least one pair of complementary outputs of said bit lines, a second lead connected to each of first and second nodes and gates connected in an enabled state; a pair of precharging transistors each having a first lead connected to each of said first and second nodes, a second lead connected to a power supply and gates each disabled in response to said means for determining; a third precharging transistor having first and second leads connected to each of said first and second nodes and having a gate disabled in response to said means for determining; a pair of first and second coupling transistors each having a first lead connected to each of said first and second nodes respectively and each having second leads connected to each other at a third node, said first and second coupling transistors each having gates connected to said second and first nodes respectively; an enablinq transistor having a first lead connected to said third node, a second lead connected to a power supply return and a gate enabled in response to said means for determining; and complementary voltage outputs at said first and second nodes.

10. A circuit as set forth in claim 9 wherein said first and second nodes each include an inverter having an input connected thereto.

11. A circuit as set forth in claim 1 further comprising means, responsive to said means for determining, for deactivating a word line signal of said array.

12. A circuit as set forth in claim 1 wherein an output signal is generated by 12 adjacent memory cells having data outputs connected in parallel.

13. A circuit as set forth in claim 12 wherein said predetermined voltage change is at least half of a power supply voltage.

14. A circuit as set forth in claim 13 wherein said means for determining comprises an inverter.

15. A circuit as set forth in claim 13 wherein said means for addressing includes means for activating an addressed array word line and said dummy word line in response to a RAM precharge signal.

16. A random access memory (RAM) comprising:
    a plurality of memory cells formed into groups of rows and columns upon a semiconductor chip;
    a plurality of additional memory cells arranged in a dummy row and dummy column formed in conjunction with a RAM array of rows and columns, each memory cell of said dummy column connected from a corresponding memory cell at a far end of said dummy row opposite an X decoder input end and said dummy row having a dummy word line separate from word lines of said array and said dummy column having bit lines separate from bit lines of said array;

means for addressing said dummy word line at a time synchronized with an addressing of said array word lines;

means, responsive to said means for addressing, for determining the occurrence of a predetermined voltage change at one of said dummy bit lines carrying a signal of at least one memory cell of said dummy column, said memory cell having a word line input connected to said dummy word line; and means, responsive to said means for determining, for sensing a signal on said array bit lines.

17. A random access memory as set forth in claim 16 wherein said dummy bit lines carries a signal generated by a plurality of adjacent memory cells having bit line outputs connected in parallel and word line inputs each connected in parallel to said dummy word line, all other memory cells of said dummy column having word line inputs deasserted.

18. A random access memory as set forth in claim 17 wherein said dummy column includes a first group of adjacent memory cells, adjacent said dummy row, each having a first bit line output signal permanently equal to one of a zero and one logic value and having a second bit line output signal permanently equal to the complementary logic value of said first bit line signal.

19. A random access memory as set forth in claim 18 wherein said dummy column includes a second group of adjacent memory cells, adjacent said first group of memory cells, each having bit line output signals permanently equal to complementary logic values relative to the bit line output signals of said first group, said second group located further along said column from said dummy row than said first group.

20. A random access memory as set forth in claim 19 wherein said second group includes a number of memory cells equal in number to that of said first group.

21. A random access memory as set forth in claim 16 wherein said means for determining includes means for comparing said predetermined voltage change to a threshold voltage value.

22. A random access memory as set forth in claim 16 wherein said means for sensing includes means for amplifying said predetermined voltage change to equal a standard logic value.

23. A random access memory a set forth in claim 22 wherein said means for amplifying includes means, responsive to said means for sensing, for increasing a voltage difference between complementary high and low bit line outputs of said RAM array to equal a standard logic value voltage difference.

24. A random access memory as set forth in claim 22 wherein said means for amplifying includes a pair of weak pass transistors each having a first lead connected to each of at least one pair of complementary outputs of said bit lines, a second lead connected to each of first and second nodes and gates connected in an enabled state; a pair of precharging transistors each having a first lead connected to each of said first and second nodes, a second lead connected to a power supply and gates each disabled in response to said means for determining; a third precharging transistor having first and second leads connected to each of said first and second nodes and having a gate disabled in response to said means for determining; a pair of first and second coupling transistors each having a first lead connected to each of said first and second nodes respectively and each having second leads connected to each other at a third node, said first and second coupling transistors each having qates connected to said second and first nodes respectively; an enabling transistor having a first lead connected to said third node, a second lead connected to a power supply return and a gate enabled in response to said means for determining; and complementary voltage outputs at said first and second nodes.

25. A random access memory as set forth in claim 24 wherein said first and second nodes each include an inverter having an input connected thereto.

26. A random access memory as set forth in claim 16 wherein an output signal is generated by 12 adjacent memory cells having data outputs connected in parallel and said predetermined voltage change is at least half a power supply voltage.

27. A random access memory as set forth in claim 26 wherein said means for determining comprises an inverter.

28. A random access memory as set forth in claim 16 further comprising means, responsive to said means for determining, for deactivating a word line signal of said array.

29. A random access memory as set forth in claim 16 wherein said means for addressing includes means for activating an addressed array word line and said dummy word line in response to a RAM precharge signal.

30. A random access memory as set forth in claim 16 wherein each of said dummy row and said dummy column include a number of memory cells at least equal to that of each of said array rows and array columns, respectively.

31. A sense enable timing circuit for accessing a data location in a static random access memory (RAM) array having a plurality of memory cells arranged into rows and columns comprising:

a plurality of additional memory cells forming a dummy row and dummy column adjacent the array rows and columns and having an electrical path from a word line input to a bit line output that is at least as long as the longest electrical path from an array word line input to an array bit line output;

means for addressing the word line of the dummy row and column and word lines of the array rows and columns at substantially the same time; and means, responsive to the occurrence of a predetermined voltage at an output of the bit line of the dummy row and column, for sensing a bit line signal at an array bit line output to determine a data value.

* * * * *